United States Patent [19]
Harada

[11] Patent Number: 5,298,780
[45] Date of Patent: Mar. 29, 1994

[54] SEMICONDUCTOR DEVICE AND METHOD OF FABRICATING SAME

[75] Inventor: Masana Harada, Itami, Japan

[73] Assignee: Mitsubishi Denki Kabushiki Kaisha, Tokyo, Japan

[21] Appl. No.: 980,691

[22] Filed: Nov. 24, 1992

[30] Foreign Application Priority Data

Feb. 17, 1992 [JP] Japan ................................ 4-029561

[51] Int. Cl.$^5$ ..................... H01L 29/06; H01L 21/225
[52] U.S. Cl. ..................................... 257/330; 257/333;
257/336; 257/332; 257/405; 257/655; 437/90;
437/105; 437/141; 437/164; 437/203; 437/233;
437/913
[58] Field of Search ............... 257/330, 332, 333, 336,
257/405, 655; 437/90, 105, 141, 164, 203, 233,
913

[56] References Cited

U.S. PATENT DOCUMENTS 5,166,762 11/1992 Yoshida ................. 257/401

OTHER PUBLICATIONS

IEEE Transactions on Electron Devices, vol. ED-34, No. 11, Nov. 1987, H. R. Chang, et al., "Self-Aligned UMOSFET's With A Specific On-Resistance of 1mΩ-cm$^2$", pp. 2329-2334.
IEDM 90, pp. 793-797, K. Shenal, et al., "Optimum Low-Voltage Silicon Power Switches Fabricated Using Scaled Trench MOS Technologies".
IEEE Transactions On Electron Devices, vol. 36, No. 9, Sep. 1989, H. R. Chang, et al., "500-V n-Channel Insulated-Gate Bipolar Transistor With A Trench Gate Structure", pp. 1824-1829.

Primary Examiner—Edward Wojciechowicz
Attorney, Agent, or Firm—Oblon, Spivak, McClelland, Maier & Neustadt

[57] ABSTRACT

There is disclosed a semiconductor device having a vertical channel MOS gate structure wherein grooves (40) are formed from the top surface of source regions (5) through a body (3) into an N diffusion region (2) and wherein buried gate electrodes (4) fill an inner part of said grooves (40) which is in face-to-face relation to the N diffusion region (2) across gate oxide films (13) while buried oxide films (15) including diffusion source impurities fill an inner part thereof which is in face-to-face relation to the source regions (5). The impurity concentration of the source regions (5) is distributed uniformly in the vertical direction of the grooves (40) and decreases laterally away from the grooves (40). A current flows through the source region along the grooves and a resistance thereagainst is held small in an ON-state. The grooves may be formed with narrow spacing. The size reduction and high integration of the semiconductor device are achieved as well as reduction in ON-resistance.

21 Claims, 14 Drawing Sheets

SEMICONDUCTOR DEVICE AND METHOD OF FABRICATING SAME

BACKGROUND OF THE INVENTION

1. Field of the Invention

The present invention relates to semiconductor devices having a vertical channel MOS gate structure and more particularly to power devices having U-shaped and V-shaped grooves.

2. Description of the Background Art

A DMOSFET structure in which channels are formed laterally along a substrate surface is a dominant MOSFET structure for power devices. It has been indicated, however, that the structure finds difficulty in size reduction of unit cells and high integration for reduction in ON-voltage.

Figure 17:
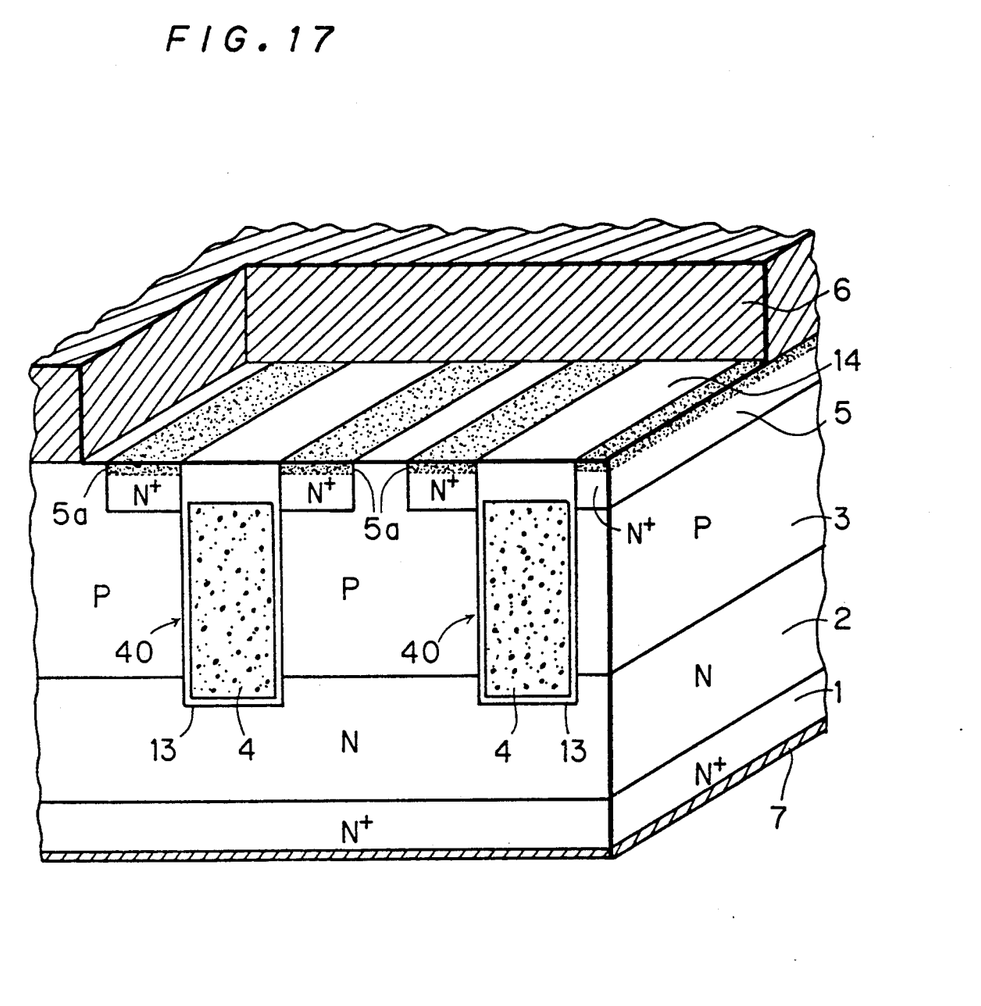
FIGS. 17 and 18 are perspective sectional views of the prior art, respectively.

For solving the disadvantages, a MOSFET having U-shaped grooves or a trench structure has been proposed. FIG. 17 shows a conventional power MOSFET having a U-groove gate structure.

The power MOSFET of FIG. 17 comprises a drain electrode metal 7, a drain region 1, an N diffusion region 2 and a body 3 which are stacked in this order. Source regions 5 are formed in the surface of the body 3 by impurity diffusion. U-shaped grooves 40 are formed from the source regions 5 through the body 3 into the N diffusion region 2. Buried gate electrodes 4 are provided within the grooves 40 through gate oxide films 13. The source regions 5 and body 3 are covered with a source electrode metal 6, which is insulated from the buried gate electrodes 4 by oxide films 14. Such a U-groove gate structure is advantageous for reduction in ON-voltage because channels are formed on all side walls of the grooves 40 so that the length of the grooves 40 is fully effectively utilized. The grooves 40 adjacent to each other, when spaced more shortly for size reduction and high integration, make it difficult to expose the body 3 between the source regions 5 adjacent to each other. This is caused by restrictions in fabricating techniques such as pattern and superposing accuracies in photolithography which are required in arranging the grooves 40 centrally of the source regions 5. This restricts the reduction of the all dimension and high integration of cells. Then there is a limitation in reducing on resistance.

Figure 18:
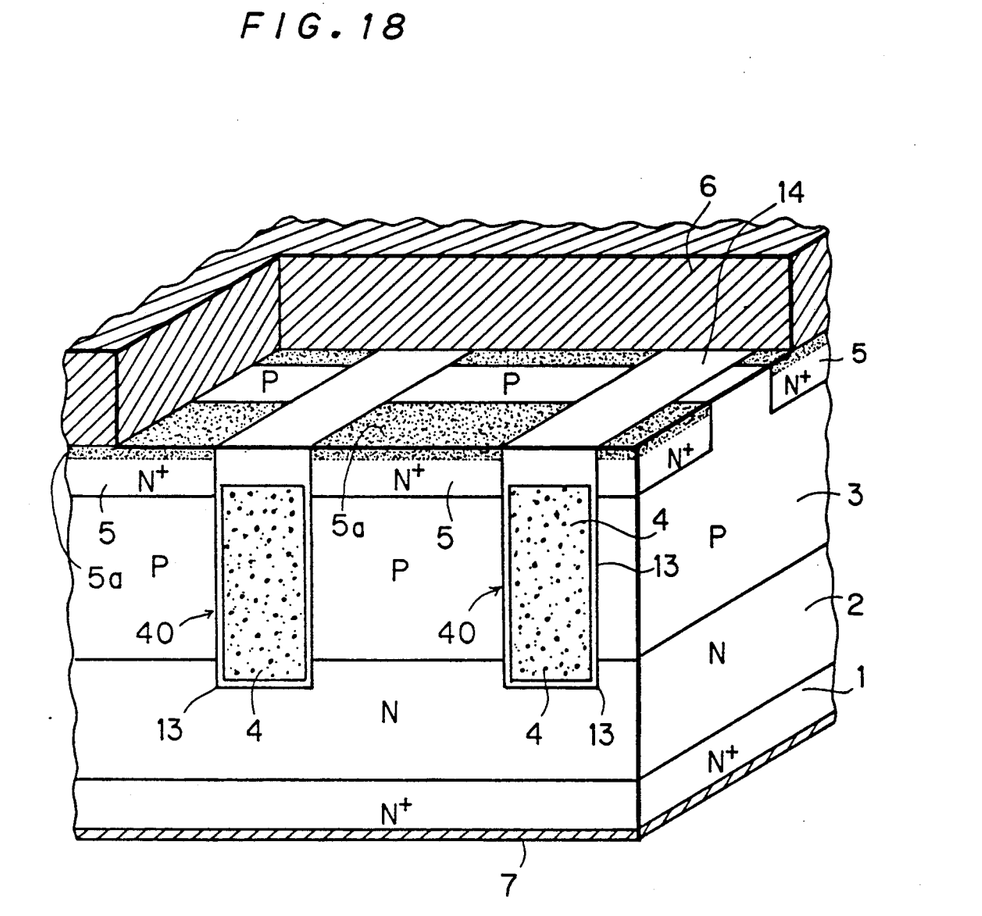

Structures for avoiding such problems have been proposed. FIG. 18 shows another conventional power MOSFET. The rectangular source regions 5 are equally spaced perpendicular to the U-shaped grooves 40. The source regions 5 and body 3 are short-circuited by the source electrode metal 6 on exposed surface of body 3 at this spacing. Such a structure permits channel regions to be formed in self-aligned fashion independent of the pattern of the U-shaped grooves 40. Positional relation between the source regions 5 and U-shaped grooves 40 need not be determined with very high accuracy, and a high pattern accuracy is unnecessary.

However, the structure of FIG. 18 has shorter total channel width than the structure of FIG. 17. One of the improvements thereagainst is to increase the width of the source regions 5 to decrease the area of the exposed surface of the body 3. This increases a distance from the center to the short-circuited edge of the source region and increases the resistance between the both ends of the distance in the body 3 under the corresponding source region. Then, the short-circuited efficiency is weakened at the point of the body 3 under the center of source region, so that it is difficult to suppress faulty operations of the MOSFET due to parasitic NPN transistors. There is another disadvantage in reducing on-resistance in both structure shown in FIGS. 17 and 18.

Figure 19:
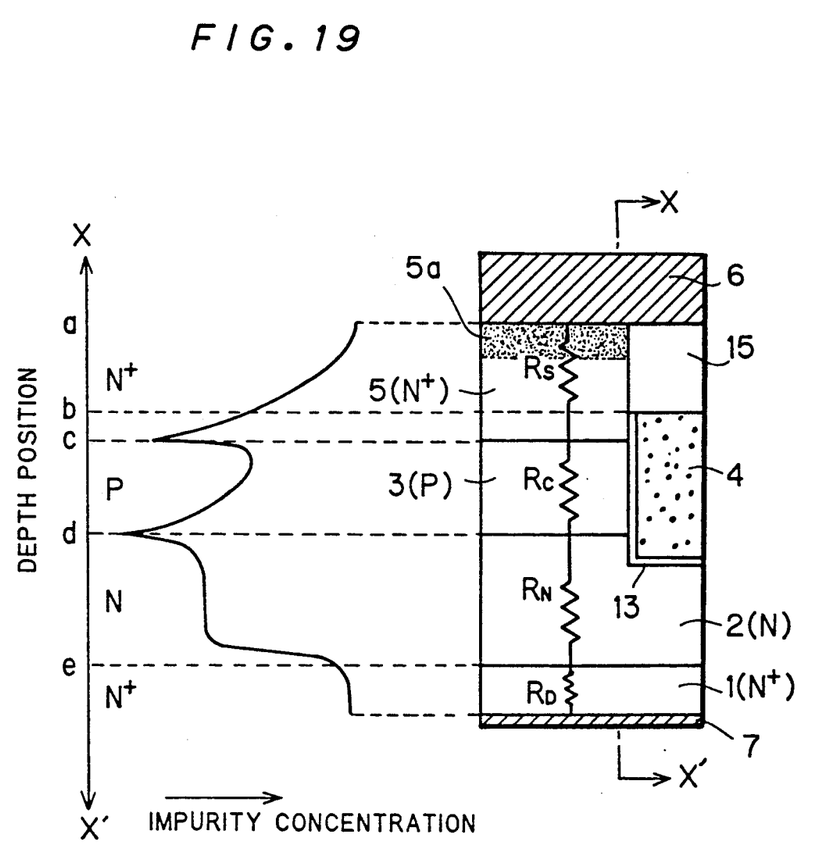
FIG. 19 is an illustration of the prior art.

FIG. 19 shows a cross section of the structure in the vicinity of the U-shaped groove 40 and a profile of impurity concentration in XX' direction (in the direction of thickness). The structure of FIG. 19 is applied to both of the MOSFETs of FIGS. 17 and 18. Electrons flow from the source regions 5 through the channel region in the body 3 and N diffusion region 2 to the drain region 1 when the MOSFET is on. (It should be noted that current flows in the direction opposite to the electrons.) An ON-resistance is hence determined by a source resistance $R_S$ in the source regions 5, a channel resistance $R_C$ in the channels to be formed in the body 3 adjacent to the grooves 40, a resistance $R_N$ in the N diffusion region 2 and a drain resistance $R_D$ in the drain region 1.

The source resistance $R_S$ is determined by the distribution of the impurity concentration of the source regions 5. Since the source regions 5 are formed by impurity diffusion from the surface of the body 3 in the conventional structure, regions 5a with relatively high impurity concentration are formed only about the surface of the body 3. As shown in the profile of FIG. 19, the impurity concentration of the source regions 5 decreases toward the drain region 1. The source resistance $R_S$ increases toward the drain region 1. Therefore, it is difficult to reduce the ON-resistance on the whole.

The vertical channel MOS gate structure is essentially efficient for reducing ON-resistance. However, as mentioned above, the conventional devices with the vertical channel MOS gate structure have some difficulties in reducing size and so on, then the adaptation is not fully exhibited.

SUMMARY OF THE INVENTION

According to the present invention, a semiconductor device comprises: a first semiconductor layer of a first conductivity type having first and second major surfaces; a second semiconductor layer of a second conductivity type formed on the first major surface; a third semiconductor layer of the first conductivity type selectively formed on the second semiconductor layer; a groove extending from a top surface of the third semiconductor layer through the second semiconductor layer into the first semiconductor layer; a dielectric layer formed at least on an inner wall of the groove which is in face-to-face relation to the second semiconductor layer; a control electrode formed on the inner wall of the groove through the dielectric layer; and an insulating layer formed on a part of an inner wall of the groove which is in face-to-face relation to the third semiconductor layer and having an impurity of the first conductivity type, a portion of the third semiconductor layer adjacent to the groove having a uniform impurity concentration in the vertical direction along the groove.

The present invention is also directed to a method of fabricating a semiconductor device. According to the present invention, the method comprises the steps of: (a) providing a first semiconductor layer of a first conductivity type having first and second major surfaces; (b) forming a second semiconductor layer of a second conductivity type on the first major surface; (c) forming a groove extending through from a top surface of the second semiconductor layer into the first semiconductor layer, the groove having a first region in the vicinity of the top surface of the second semiconductor layer and a second region other than the first region; (d) forming a dielectric layer on an inner wall of the groove in the second region; (e) forming a control electrode on the dielectric layer; (f) forming an insulating layer having a diffusion source impurity of the first conductivity type at least on an inner wall of the groove in the first region; and (g) diffusing the diffusion source impurity from the insulating layer to selectively form a third semiconductor layer of the first conductivity type in the second semiconductor layer in contact with the groove, the third semiconductor layer being at least longer than the first region in the direction of the thickness of the second semiconductor layer.

According to the present invention, the third semiconductor layer is formed by impurity diffusion from the insulating layer provided inside the groove and having the diffusion source impurity. The impurity concentration thereof is uniformly distributed in the direction of a current flow and decreases laterally away from the groove. This enables a voltage drop to be minimized which is generated by a current flow in the vicinity of the groove in the third semiconductor layer. The spacing between the adjacent grooves is easily shortened.

As described hereinabove, since the impurity concentration of the third semiconductor layer is uniform in the direction of current pass, a resistance against the current flowing in this region is held small. Therefore the semiconductor device having a reduced ON-resistance is achieved. In addition, since the impurity concentration of the third semiconductor layer decreases as the lateral distance from the groove increases, the length of the third semiconductor layer in the lateral direction along the surface is reduced without lowering the impurity concentration of the third semiconductor layer in the vicinity of the groove. Therefore the semiconductor device is provided which achieves size reduction and high integration with ease.

It is an object of the present invention to provide a semiconductor device with reduced size and low ON-resistance which is capable of adaptation for size reduction and high integration, and a method of suitably fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
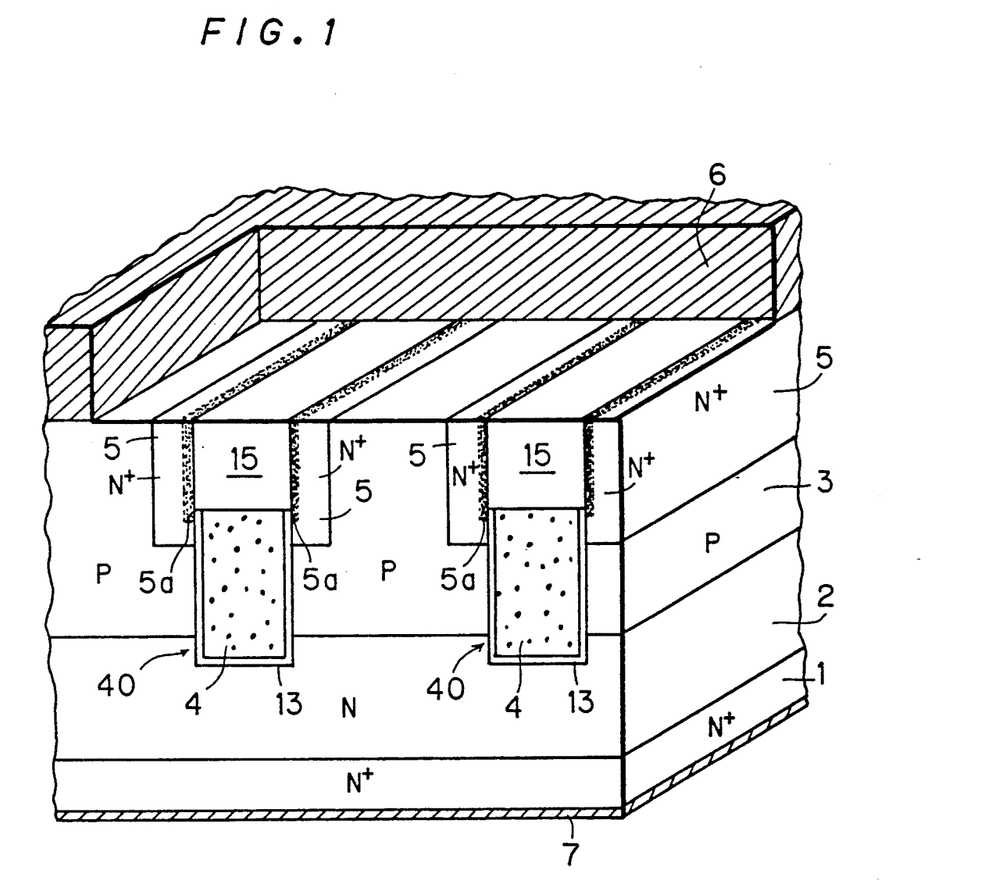
FIG. 1 is a perspective sectional view of a first preferred embodiment according to the present invention;
p

FIG. 1 shows an N channel power MOSFET of a first preferred embodiment according to the present invention. The MOSFET of FIG. 1 comprises a drain region 1 made of N+ type semiconductor, an N diffusion region (drift layer) 2 made of N type semiconductor and a body 3 made of P type semiconductor which are stacked in this order. Source regions 5 are formed selectively in the surface of the body 3. Grooves 40 are formed from the source regions 5 through the body 3 into the N diffusion region 2. The grooves 40 in their lower portion between the bottom thereof and the position upper than the bottom of the source regions 5 are filled with buried gate electrodes 4 on gate oxide films 13. The grooves 40 in their upper portion are filled with buried oxide films 15 including N type impurities. A source electrode metal 6 covers the source regions 5 and body 3 to short-circuit them, and is insulated from the buried gate electrodes 4 by the buried oxide films 15.

The source regions 5 are formed by impurity diffusion from the buried oxide films 15, and includes impurity regions 5a of relatively high concentration formed adjacent to the grooves 40.

Figure 2:
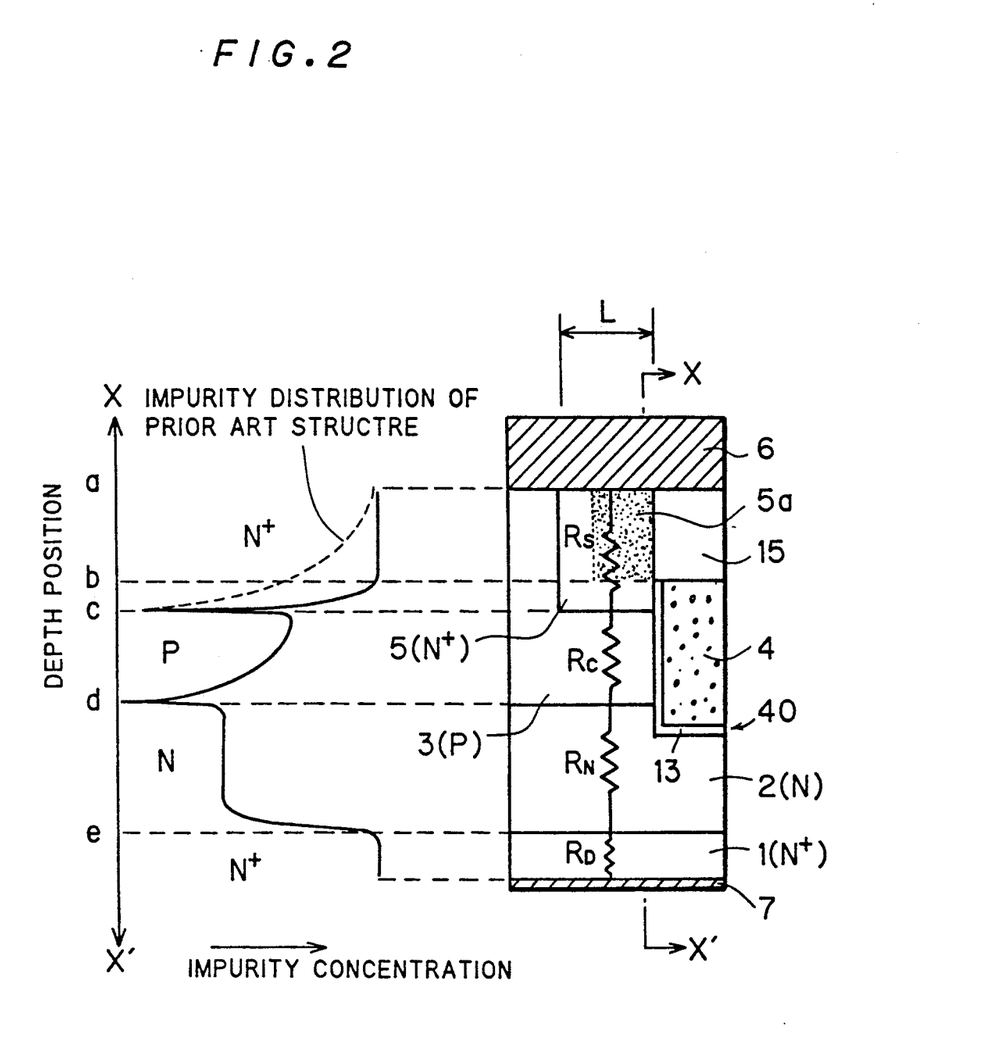
FIG. 2 is an illustration of the first preferred embodiment.

FIG. 2 shows a cross section of the MOSFET of the first preferred embodiment in the vicinity of the groove 40 and a profile of impurity concentration in XX' vertical direction. The impurity concentration of the source regions 5 is uniformly distributed in the vertical direction along the side of the groove in the first preferred embodiment. The impurity concentration of the first preferred embodiment is higher than the impurity concentration of the prior art indicated by a broken curve at the bottom of the source regions 5. The source resistance $R_S$ is held smaller as compared with the prior art.

The width L of the source regions 5 can be reduced to 1 $\mu$m or less, in particular about 300 to 500 nm. In this case, the impurity regions 5a of relatively high concentration are ensured in the vicinity of the grooves 40. This facilitates reduction in spacing between the adjacent grooves 40, and provides for size reduction and high integration of the device.

Description will be given on a concrete method for achievement of the MOSFET having the foregoing structure. FIGS. 3 to 14 show a method of fabricating the MOSFET of the first preferred embodiment in sequence of fabrication according to a second preferred embodiment of the present invention.

Figure 3:
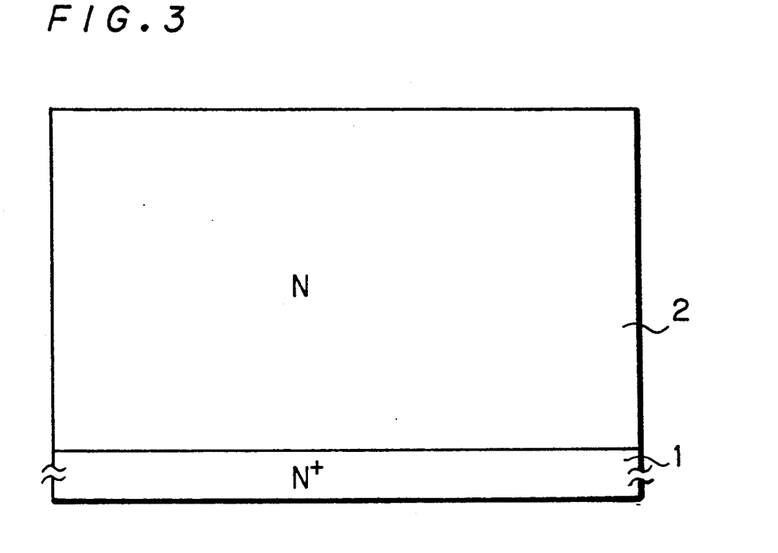
FIGS. 3 to 14 are cross-sectional views of a second preferred embodiment in sequence of fabrication according to the present invention.
Figure 4:
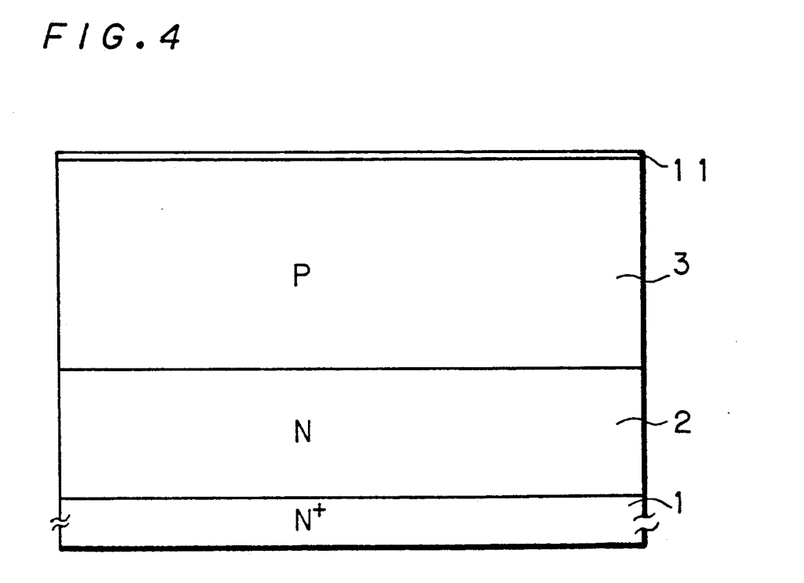

The N diffusion region 2 is formed on an N+ type semiconductor substrate which becomes the drain region 1 by epitaxial growth technique as shown in FIG. 3. An oxide film 11 is formed on the surface of the N diffusion region 2. P type impurities are diffused into the surface of the N diffusion region 2 by ion implantation or the like through the oxide film 11, so that the body 3 is formed as shown in FIG. 4.

Figure 5:
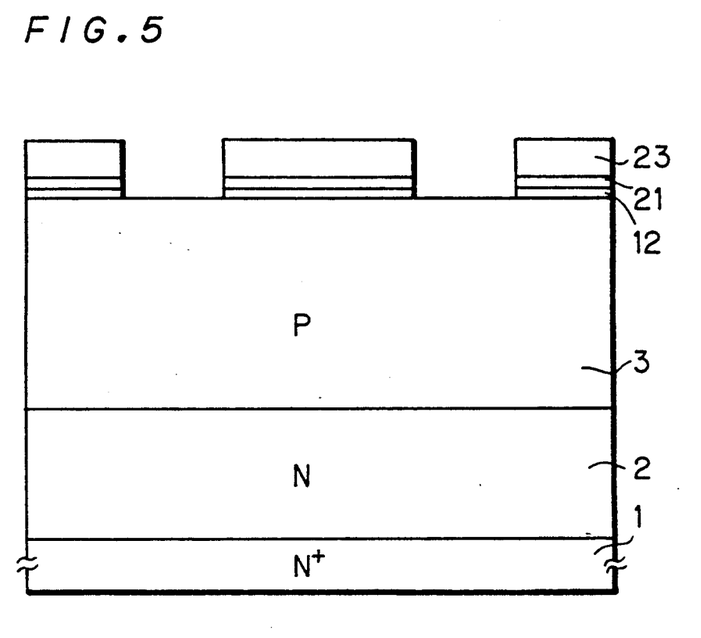

The oxide film 11 is removed. A nitride film 21 of 50 to 70 nm thick is formed on the surface of the body 3, with a thin oxide film 12 of not more than 100 nm formed thereunder as a ground by oxidation. A thick CVD oxide film 23 is in turn formed on the nitride film 21. The oxide films 12, 13 and nitride film 21 are selectively removed in regions for grooves to selectively expose the body 3 as shown in FIG. 5. The thin oxide film 12 is preferably 30 to 100 nm in thickness.

Figure 6:
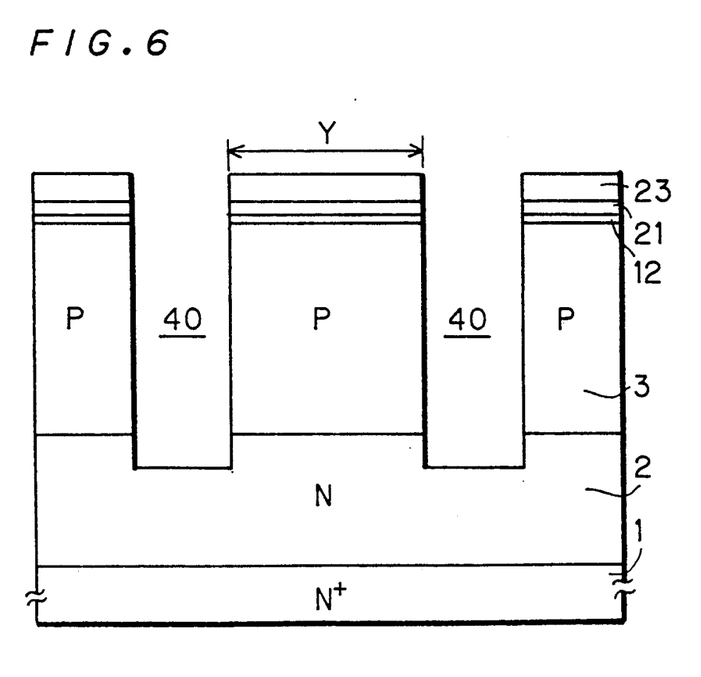

Anisotropic etching is carried out using the CVD oxide film 23 as an etching mask to form the grooves 40 as shown in FIG. 6. As above described, the spacing Y between the adjacent grooves 40 can be reduced to 1.5 to 2.0 μm. The grooves 40 are formed through the body 3 so that the body 3 and channels are formed when the MOSFET is on. The CVD oxide film 23 is then removed.

Figure 7:
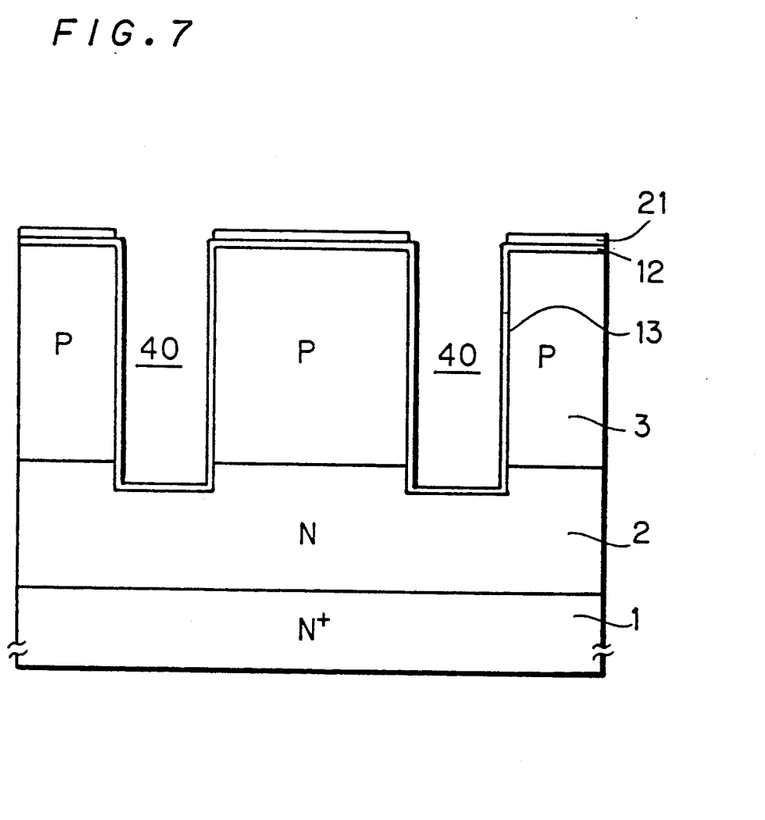
Figure 8:
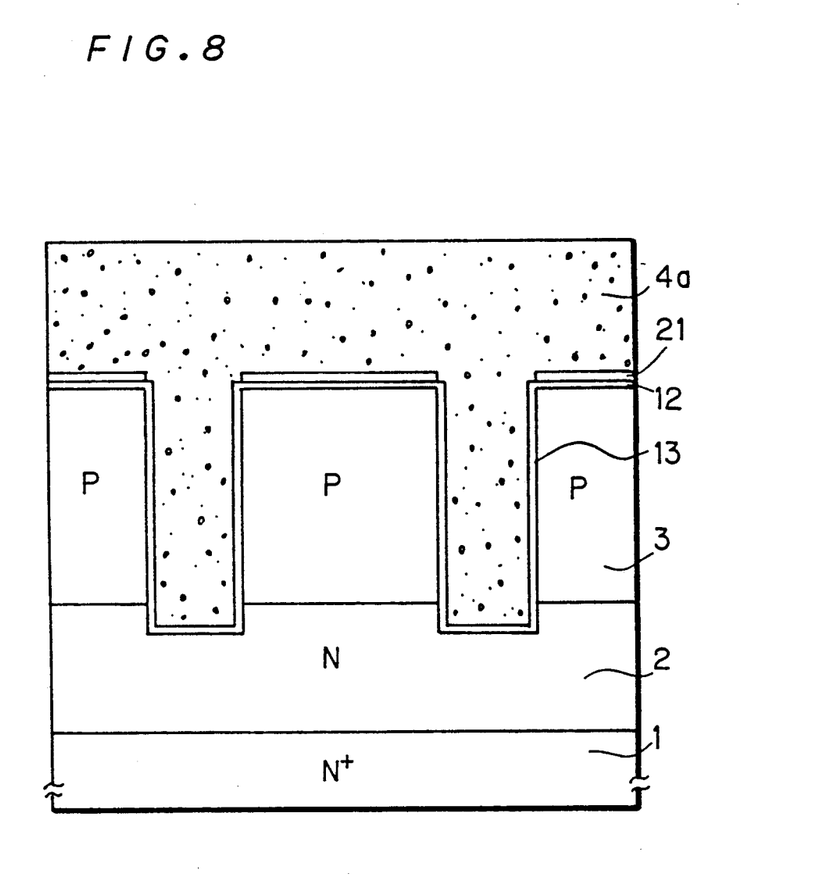

Oxidation is carried out while the nitride film 21 suppresses oxidation on the surface of the body 3, to form the gate oxide films 13 on the inner walls of the grooves 40 as shown in FIG. 7. The grooves 40 are fully filled with a thick conductive film 4a such as doped polysilicon. The conductive film 4a is formed in thicknesses of about 1.5 to 3 times the half width of the grooves 40 in order to completely fill the grooves 40 and level the top thereof in the successive step, as shown in FIG. 8.

Figure 9:
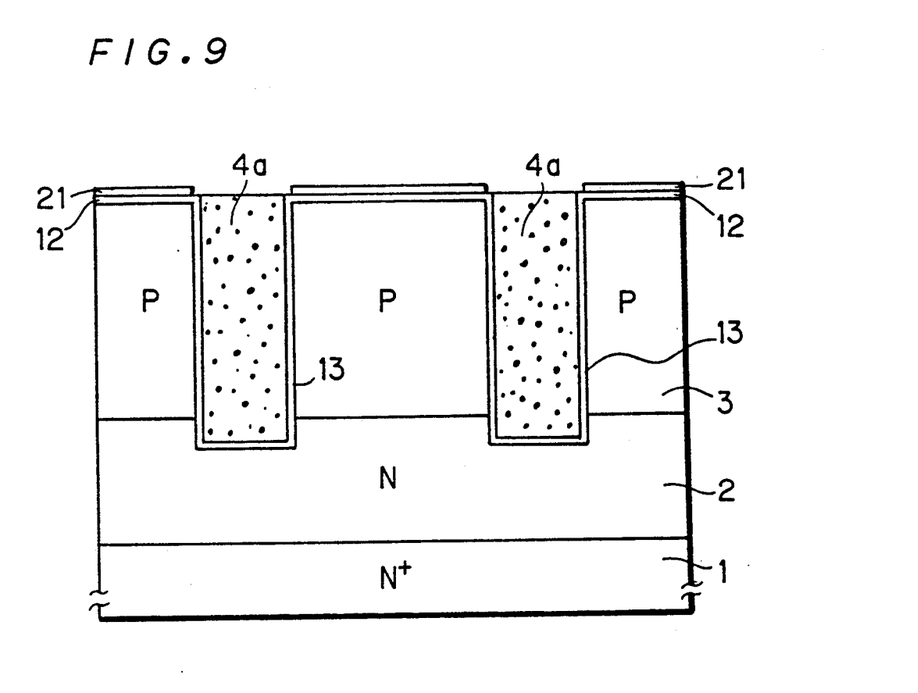
Figure 10:
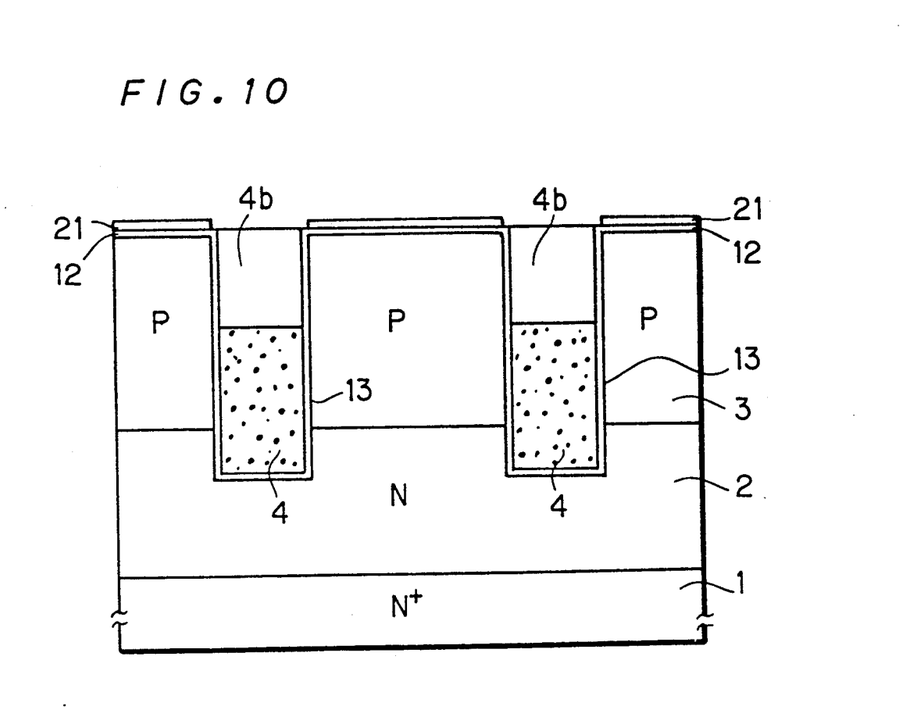

The conductive film 4a is leveled by etchback or the like. This permits the nitride film 21 to be exposed, the conductive film 4a being left only inside the grooves 40, as shown in FIG. 9. The upper portions of the conductive film 4a are oxidized while the nitride film 21 suppresses oxidation on the surface of the body 3, to form oxide films 4b. The conductive film 4a in their lower portions is left which becomes the buried gate electrodes 4 as shown in FIG. 10. The oxide films 4b, the thickness of which determines the depth of the source regions 5, are not allowed to be deeper than the body 3.

Figure 11:
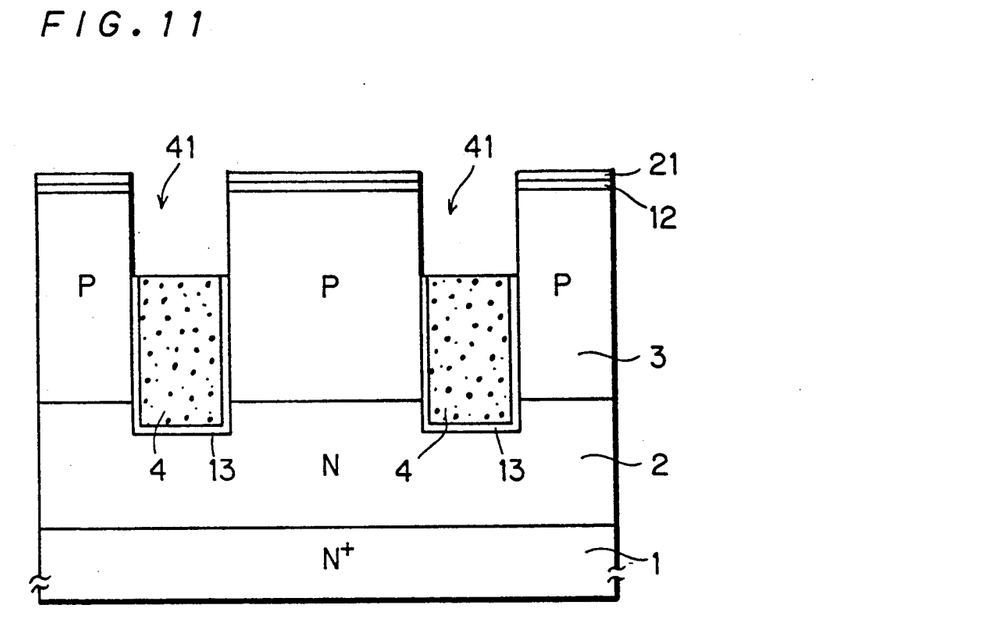
Figure 12:
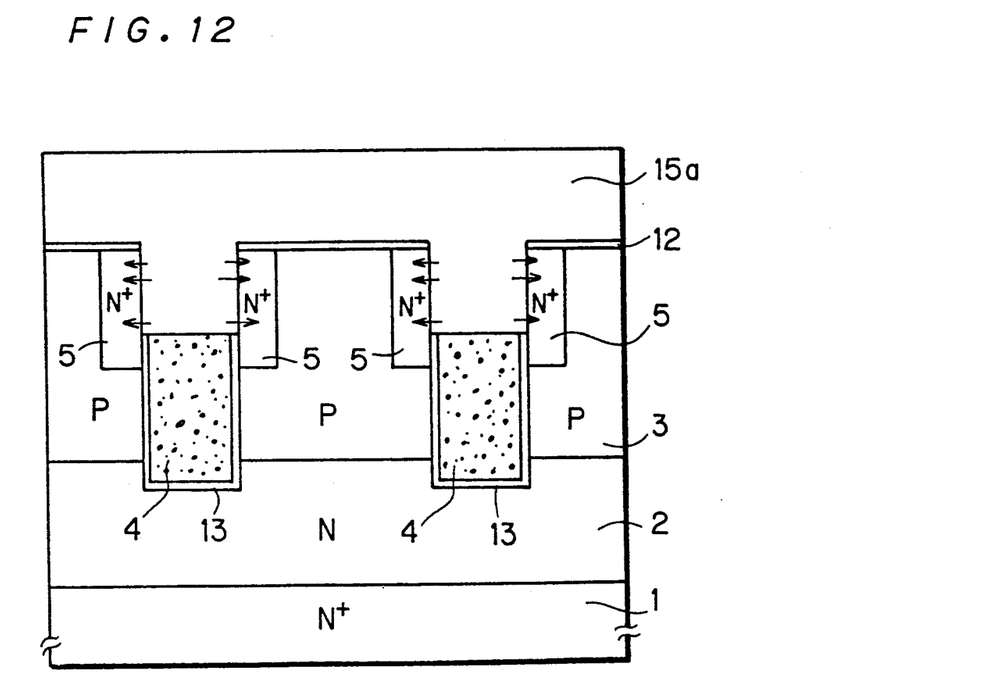

The oxide films 4b and parts of the oxide films 13 which contact therewith are removed to expose the upper portions of the grooves 40. This permits the body 3 to have recesses 41 as shown in FIG. 11. The nitride film 21 is removed, and an oxide film 15a including N type impurities is formed thick by means of CVD technique to fill up the recesses 41. Heat treatment enables the impurities to be diffused from the oxide film 15a into the body 3, so that the N+ type source regions 5 are formed as shown in FIG. 12. When an oxide film is used which includes phosphorus (P) and arsenic (As) at impurity concentrations of $10^{20}$ to $10^{21}$ cm$^{-3}$, for example, the source regions 5 of the impurity concentration of $5 \times 10^{19}$ cm$^{-3}$ or more are formed in the vicinity of the grooves 40 by heat treatment at 950° C. for thirty minutes. The diffusion provides the uniform distribution of the impurity concentration of the source regions 5 in the vertical direction along the vicinity of the groove. In addition, since the oxide film 12 prevents the diffusion, the impurity concentration of the source regions 5 decreases away from the grooves 40. Since the formation of the grooves 40 precedes the diffusion, the source regions 5 are formed in self-aligned fashion along the grooves 40.

Figure 13:
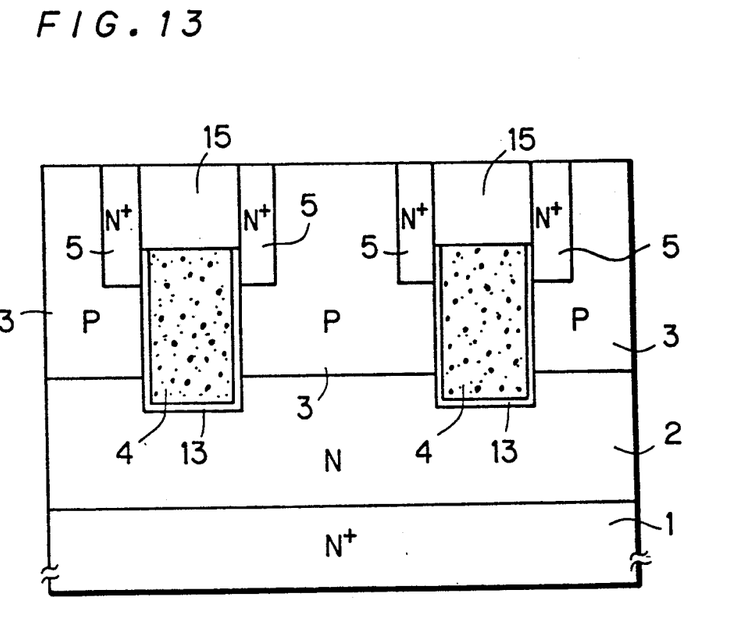

The oxide film 15a and oxide film 12 both are leveled by etching, whereby the buried oxide films 15 are left, the body 3 and source regions 5 being exposed as shown in FIG. 13. The oxide film 12, which might have a smaller etching rate as compared with the oxide film 15a formed by the CVD technique, is required to be formed thin as described with reference to FIG. 5. Otherwise the oxide film 15a inside the grooves 40 might be removed before the oxide film 12 is removed throughout.

Figure 14:
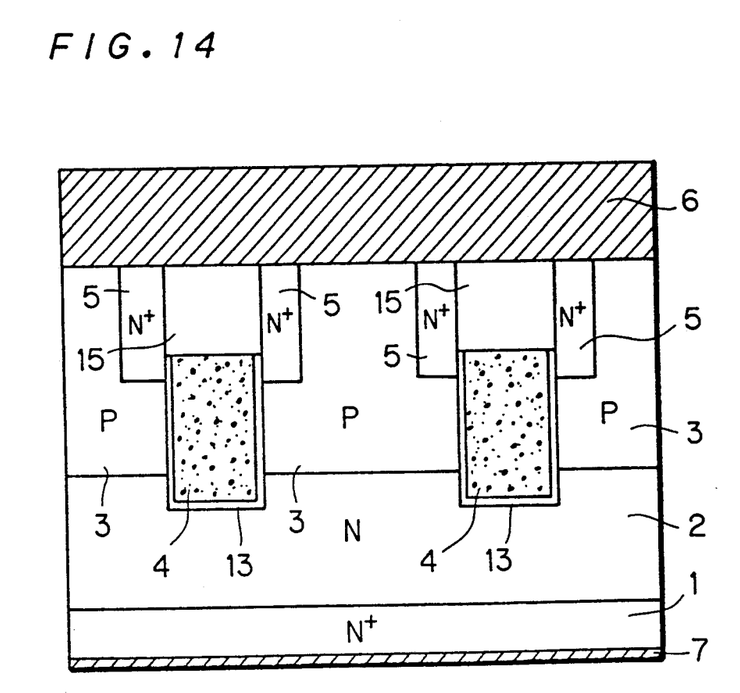

The source electrode metal 6 and drain electrode metal 7 are formed on the top and bottom surfaces of the structure of FIG. 13, respectively. The MOSFET of the first preferred embodiment is thus formed as shown in FIG. 14.

Figure 15:
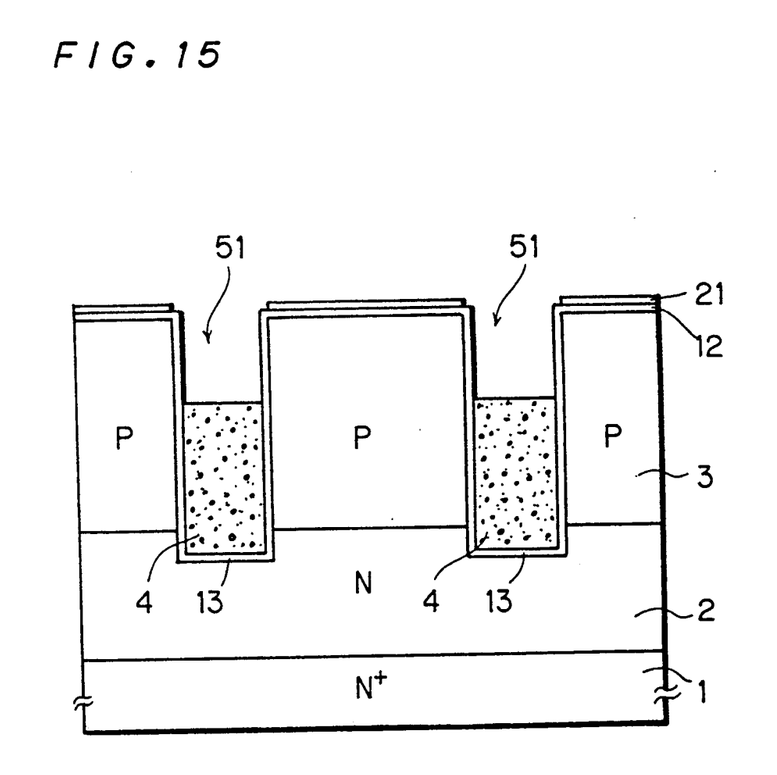
FIG. 15 is a cross-sectional view showing the step of forming recesses 51.

The conductive film 4a may be removed in the upper portions to leave the buried electrodes 4 without oxidizing the conductive film 4a. With reference to FIG. 15, recesses 51 may be formed by excessive etching for leveling to remove the gate oxide films 13 exposed in the recesses 51 by further etching. This simplifies the fabrication steps.

The N channel power MOSFET is described in the first and second preferred embodiments. The present invention is also applicable to a P channel power MOSFET, which includes the semiconductors of all the reversed conductivity types.

Figure 16:
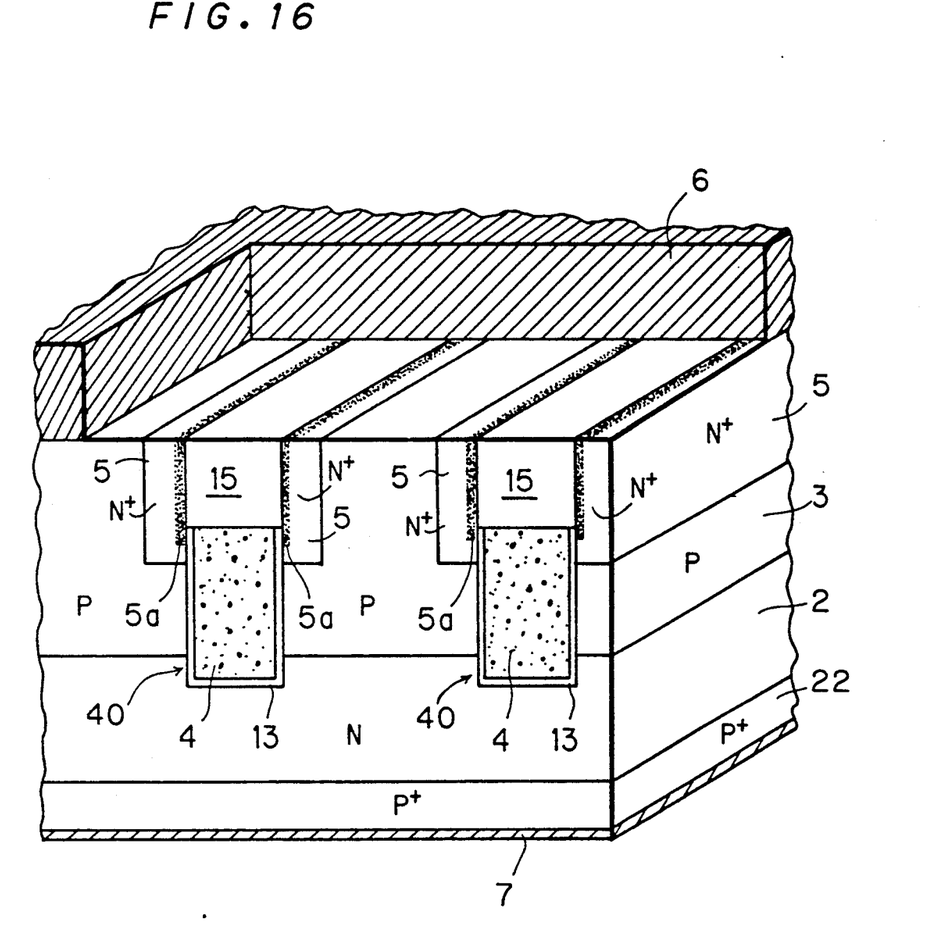
FIG. 16 is a perspective sectional view of a third preferred embodiment according to the present invention.

Referring to FIG. 16, there is provided according to a third preferred embodiment of the present invention an insulating gate bipolar transistor (IGBT) structured such that a P+ type semiconductor layer 22 is substituted for the drain region 1 of the first preferred embodiment. The IGBT of the third preferred embodiment provides the effects similar to the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a first semiconductor layer of a first conductivity type having first and second major surfaces;
    a second semiconductor layer of a second conductivity type formed on said first major surface;
    a third semiconductor layer of the first conductivity type selectively formed on said second semiconductor layer;
    a groove extending from a top surface of said third semiconductor layer through said second semiconductor layer into said first semiconductor layer;
    a dielectric layer formed at least on an inner wall of said groove which is in face-to-face relation to said second semiconductor layer;
    a control electrode formed on said inner wall of said groove through said dielectric layer; and
    an insulating layer formed on a part of an inner wall of said groove which is in face-to-face relation to said third semiconductor layer and containing an impurity of the first conductivity type,
    a portion of said third semiconductor layer adjacent to said groove having a uniform impurity concentration in the vertical direction along said groove.

2. The semiconductor device of claim 1, wherein said dielectric layer is further formed on an inner wall of said groove which is in face-to-face relation to said first semiconductor layer.

3. The semiconductor device of claim 2,
    wherein said control electrode fills a region surrounded by said dielectric layer, and
    wherein said insulating layer fills said groove associated with said dielectric layer and said control electrode.

4. The semiconductor device of claim 3, wherein said impurity concentration of said third semiconductor layer decreases lateraly away from said insulating layer.

5. The semiconductor device of claim 4, further comprising
    a fourth semiconductor layer of the first conductivity type formed on said second major surface of said first semiconductor layer, the impurity concentration of said fourth semiconductor layer being higher than that of said first semiconductor layer.

6. The semiconductor device of claim 5, further comprising
a first electrode formed on an surface of said fourth semiconductor layer.

7. The semiconductor device of claim 6, further comprising
a second electrode formed at least on said top surface of said third semiconductor layer.

8. The semiconductor device of claim 7, wherein said third semiconductor layer surrounds at least said insulating layer.

9. The semiconductor device of claim 8, wherein said second electrode short-circuits said second and third semiconductor layers.

10. The semiconductor device of claim 1, further comprising
a fourth semiconductor layer of the second conductivity type formed on said second major surface of said first semiconductor layer, the impurity concentration of said fourth semiconductor layer being higher than that of said second semiconductor layer.

11. A method of fabricating a semiconductor device, comprising the steps of:
(a) providing a first semiconductor layer of a first conductivity type having first and second major surfaces;
(b) forming a second semiconductor layer of a second conductivity type on said first major surface;
(c) forming a groove extending through from a top surface of said second semiconductor layer into said first semiconductor layer, said groove having a first region in the vicinity of said top surface of said second semiconductor layer and a second region other than said first region;
(d) forming a dielectric layer on an inner wall of said groove in said second region;
(e) forming a control electrode on said dielectric layer;
(f) forming an insulating layer containing a diffusion source impurity of the first conductivity type at least on an inner wall of said groove in said first region; and
(g) diffusing said diffusion source impurity from said insulating layer to selectively form a third semiconductor layer of the first conductivity type in contact with said groove on said second semiconductor layer, said third semiconductor layer being at least longer than said first region in the direction of the thickness of said second semiconductor layer.

12. The method of claim 11,
wherein said step (a) includes the step of
(a-1) forming said first semiconductor layer by epitaxial growth on a fourth semiconductor layer having an impurity concentration higher than the impurity concentration of said first semiconductor layer, said second major surface being an interface of said fourth and first semiconductor layers.

13. The method of claim 11,
wherein said step (b) includes the step of
(b-1) introducing an impurity of the second conductivity type from said first major surface.

14. The method of claim 11,
wherein said step (c) includes the steps of:
(c-1) forming a first oxide film above said second semiconductor layer;
(c-2) selectively removing and leaving said first oxide film; and
(c-3) etching said second semiconductor layer by using said left first oxide film as a mask.

15. The method of claim 14,
wherein said step (c-1) includes the steps of:
(c-1-1) forming a second oxide film on said second semiconductor layer;
(c-1-2) forming a nitride film on said second oxide film; and
(c-1-3) forming said first oxide film on said nitride film, and
wherein said step (c-2) includes the step of
(c-2-1) selectively leaving said nitride film and said second oxide film in the same configuration as said left first oxide film.

16. The method of claim 15,
wherein said step (d) includes the steps of:
(d-1) exposing said nitride film; and
(d-2) oxidizing an inside of said groove.

17. The method of claim 11,
wherein said step (e) includes the steps of:
(e-1) forming a conductive film all over a structure provided in said steps (a) to (d) to fill said groove; and
(e-2) removing said conductive film, with said conductive film left unremoved only in said second region,
said conductive film left in said second region in said step (e-2) being equivalent to said control electrode.

18. The method of claim 17,
wherein said conductive film is a polycrystalline semiconductor, and
wherein said step (e-2) includes the steps of:
(e-2-1) leveling said conductive film;
(e-2-2) oxidizing said conductive film in said first region; and
(e-2-3) removing said oxidized conductive film as well as said dielectric layer in said first region.

19. The method of claim 17,
wherein said step (e) further includes the step of
(e-3) removing said dielectric layer in said first region.

20. The method of claim 15,
wherein said step (f) includes the steps of:
(f-1) forming said insulating layer all over a structure provided in said steps (a) to (e) to fill said first region; and
(f-2) leveling said insulating layer.

21. The method of claim 20,
wherein said step (f) further includes, prior to said step (f-1), the step of
(f-3) removing said nitride film.

* * * * *